(12) United States Patent
Kurita

(10) Patent No.: US 7,507,640 B2
(45) Date of Patent: Mar. 24, 2009

(54) METHOD FOR PRODUCING SILICON WAFER

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/706,439

(22) Filed: Feb. 14, 2007

(65) Prior Publication Data

US 2007/0207595 A1 Sep. 6, 2007

(30) Foreign Application Priority Data

Feb. 15, 2006 (JP) ............................. 2006-038485

(51) Int. Cl.
*H01L 21/322* (2006.01)
(52) U.S. Cl. .................. 438/471; 438/473; 438/58; 257/E21.318; 257/E21.321
(58) Field of Classification Search .............. 438/471, 438/473; 257/E21.318
See application file for complete search history.

(56) References Cited

U.S. PATENT DOCUMENTS

| | | | | |
|---|---|---|---|---|
| 4,131,487 A | * | 12/1978 | Pearce et al. ................. | 438/473 |
| 4,231,809 A | * | 11/1980 | Schmidt ...................... | 438/477 |
| 4,782,029 A | * | 11/1988 | Takemura et al. ............ | 438/472 |
| 5,130,260 A | * | 7/1992 | Suga et al. ................... | 438/472 |
| 5,162,241 A | * | 11/1992 | Mori et al. ................... | 438/402 |
| 5,444,001 A | * | 8/1995 | Tokuyama ................... | 438/402 |
| 6,277,501 B1 | * | 8/2001 | Fujikawa .................... | 428/641 |
| 2005/0090079 A1 | | 4/2005 | Yoshida | |
| 2005/0214973 A1 | * | 9/2005 | Oyu et al. ................... | 438/106 |
| 2007/0190809 A1 | * | 8/2007 | Tanahashi et al. ........... | 438/795 |

FOREIGN PATENT DOCUMENTS

| | | |
|---|---|---|
| JP | 2002-313795 | 10/2002 |
| JP | 2003-209114 | 7/2003 |

* cited by examiner

*Primary Examiner*—Marcos D. Pizarro
*Assistant Examiner*—Igwe U. Anya
(74) *Attorney, Agent, or Firm*—Kolisch Hartwell, PC

(57) ABSTRACT

A method for producing a silicon wafer, comprising performing an activation of metallic impurities by irradiating laser light on the metallic impurities constituting contaminants in the silicon wafer, changing the electric charge of the contaminants, and activating the contaminants to a state such that the contaminants easily react with oxygen precipitation nuclei and are subjected to gettering.

9 Claims, 4 Drawing Sheets

BEFORE IRRADIATION

AFTER IRRADIATION

LIGHT IRRADIATED REGION

Cu+ : Cu ION
● : OXYGEN PRECIPITATION NUCLEUS

CuO : OXIDE PRECIPITATE (GETTERING SINK)

BEFORE IRRADIATION

Cu+ : Cu ION
● : OXYGEN PRECIPITATION
  NUCLEUS

AFTER IRRADIATION

LIGHT IRRADIATED-REGION

CuO : OXIDE PRECIPITATE
      (GETTERING SINK)

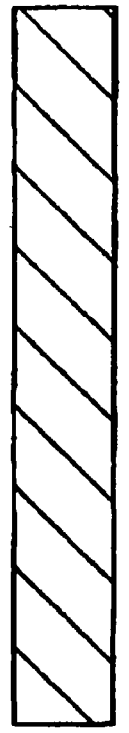
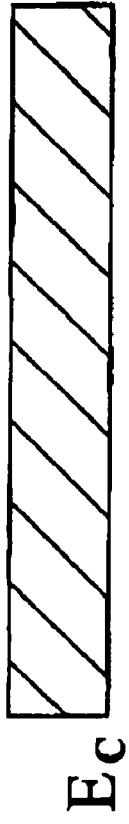
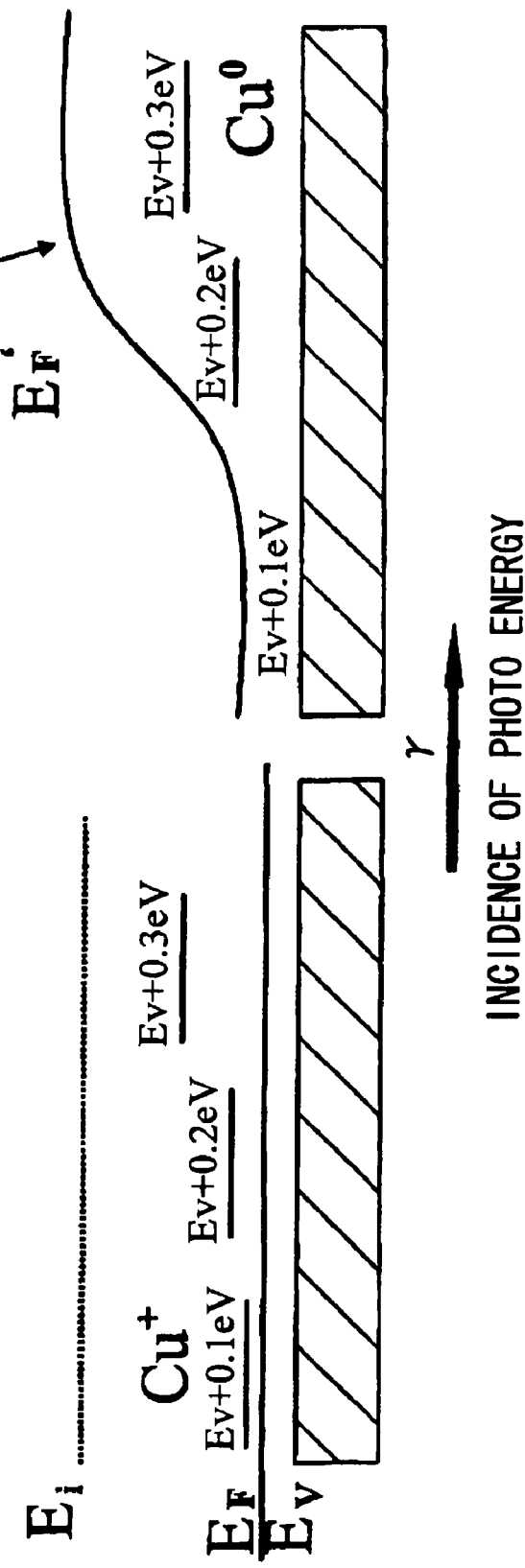
FIG. 5A  FIG. 5B

METHOD FOR PRODUCING SILICON WAFER

BACKGROUND OF THE INVENTION

1. Field of the Invention

The present invention relates to a method for producing a high-quality silicon wafer in which, in a region outside of a device active region, capable of performing gettering of metallic impurities (contaminants) such as impurities originated from raw materials of a silicon single crystal and dissolved in the silicon single crystal and impurities mixed in the silicon wafer during a device production process, and relates to a method for producing a high-quality semiconductor device which does not easily suffer from an influence of impurities in the silicon wafer. Priority is claimed on Japanese Patent Application No. 2006-038485, filed Feb. 15, 2006, the content of which is incorporated herein by reference.

2. Description of Related Art

Silicon wafers have been widely used as substrates of semiconductor devices constituting electronic devices such as portable telephones and portable communication devices. Conventionally, widely used silicon wafers had a thickness of 100 µm or more, especially 700 µm or more. However, the demand for thinning the thickness of a silicon wafer has increased in recent years in accordance with the recent development of high-performance, multifunctional electronic devices. For example, a current model of portable telephone is generally equipped with a so-called "electric eye" such as a CCD or a CMOS image sensor and a memory for storing image data obtained by the CCD or the CMOS image sensor. In order to realize such a constitution, silicon wafers used in a transceiver unit, a CCD substrate, a memory substrate or the like are worked to thin films of not thicker than 100 µm (in 2006, a thickness of less than 50 µm was realized), and stacked to form a multi-layered (plural layered) structure and are packaged. The techniques including film-thinning, multi-layer stacking, and packaging are generically called SIP (system in package) or MCP (multi chip package).

The film-thinning of a silicon wafer has been realized by grinding (back-grinding) of a back surface of the wafer using CMP or the like after the device formation process for forming a semiconductor device on a front surface of the silicon wafer. Where the thickness of the silicon wafer is controlled to be 100 µm or less by grinding, residual strain accompanied with residual stress has a substantial influence on the mechanical strength of the silicon wafer at the time of bonding of the silicon wafer. Therefore, the residual strain is removed after grinding the silicon wafer.

In addition, it is well known that contamination of a silicon wafer with metallic impurities (contaminants) deteriorates the electric properties of a semiconductor device. Therefore, there have been proposed various techniques to capture the contaminants in the silicon wafer in a region outside of a device active region. While growing a silicon single crystal, metallic elements dissolved from the raw materials contaminate the silicon single crystal. Such impurities constitute contaminants of a silicon wafer sliced from the silicon single crystal. In addition, metallic impurities such as Cu or the like contaminate the silicon wafer while forming a wiring on the silicon wafer.

As a technique for gettering of metallic impurities (contaminants) in a silicon wafer, for example, there is a technique for forming oxide precipitates by precipitating oxygen atoms contained in a silicon single crystal grown by the Czochralski method (CZ method) and utilizing strains around the oxide precipitates as the gettering sink, and thereby capturing the metallic impurities (contaminants).

In another technique, strains in polycrystalline grain boundaries of a polycrystalline film formed on the back surface of the silicon wafers are used as the gettering sink for capturing metallic impurities (contaminants).

In another technique, a film of a metal having a high melting point is provided on a back surface of a silicon single crystal wafer so as to provide an ability for gettering of impurities in the silicon single crystal (for example, Patent Reference 1: Japanese Unexamined Patent Application, First Publication, No. 2002-313795).

In addition, another technique is proposed for a method for gettering of impurities composed of transition metals that diffuse very rapidly in a silicon wafer and form a deep impurity level, especially for gettering of Co, Ni or Cu, which diffuse very rapidly at room temperature. In this technique, the silicon is doped with two types of impurities, oxygen (O) and carbon (C), and is subjected to thermal annealing. As a result, impurity composites consisting of carbon, oxygen, and transition metals are formed in specific atomic sites in the silicon crystal (For example, Patent Reference 2: Japanese Unexamined Patent Application, First Publication, No. 2003-209114).

However, since the above-described prior arts require a heat treatment for gettering, there have been problems of high production cost and labor accompanied with the heat treatment.

Where the oxide precipitate (BMD: Bulk Micro Defect) is used as a gettering sink, it is necessary to perform a heat treatment so as to grow BMDs. While the heat treatment for growing BMDs may be performed before the device process (a process for producing a device), there is a problem of production cost and labor accompanied with the heat treatment. Alternatively, for gettering of metallic impurities, the BMDs may be grown by a heat treatment in the device process. However, recently, there is a tendency to perform the device process under low temperature conditions with the intention of cost reduction. In such a case, without performing an additional heat treatment for gettering, there is a possibility that a sufficient heat treatment margin for gettering of metallic impurities (contaminants) cannot be obtained in the device process.

Where thinning of a silicon wafer is performed by grinding, the residual strain caused by the grinding and accompanied with the residual stress acts as a gettering sink of metallic impurities generated during the device process. If the residual strain accompanied with the residual stress is removed, the gettering sink is also removed and the contaminants released from the gettering sink diffuse into the device active region and deteriorate the electronic properties of the semiconductor device. A solution to this problem is to perform the heat treatment after the film-thinning of the wafer so as to grow the BMDs and perform gettering of the metallic impurities (contaminants) by the BMDs. However, it is highly possible that the heat treatment after the film-thinning causes warpage or cracking of the wafer.

Further, where Cu constitutes a contamination source, since Cu+ migrates in a silicon wafer even at room temperature, there is a possibility that desired product properties cannot be obtained because of the migration of contaminants after the device process, for example, in a process for forming a semiconductor chip, or in a process of stacking of chips to form, e.g., flash memories.

Based on the consideration of the above-described circumstances, an object of the present invention is to provide a method for producing a silicon wafer which exhibits an effective gettering of metallic impurities (contaminants) even after the silicon wafer is made into a thin film by grinding of the wafer, does not require heat treatment for gettering, and does not cause a deterioration of product properties.

Another object of the present invention is to provide a method for producing a semiconductor device which does not easily suffer from an influence of contaminants in the silicon wafer and has high quality.

SUMMARY OF THE INVENTION

In order to solve the above-described problem, a method for producing a silicon wafer according to the present invention comprises performing activation of metallic impurities by irradiating laser light on metallic impurities constituting contaminants in the silicon wafer, changing an electric charging state of the contaminants, and activating the contaminants to a state such that the contaminants easily react with oxygen precipitation nuclei and are subjected to gettering.

In the above-described method for producing a silicon wafer, a bulk of the silicon wafer may be implanted with carriers in an amount of $1 \times 10^{15}$ atoms/cm$^3$ or more by the irradiation of the laser light.

In the above-described method for producing a silicon wafer, the laser light may have a wavelength of 400 to 1100 nm and a photon energy of 1.0 to 4.0 eV.

In the above-described method for producing a silicon wafer, the silicon wafer may be sliced from a silicon single crystal which is grown by the CZ method and has a resistivity of 0.01 Ωcm or more, initial interstitial oxygen concentration of $8.0 \times 10^{17}$ atoms/cm$^3$ or more, and is doped with carbon or nitrogen in an amount of $5.0 \times 10^{12}$ to $5.0 \times 10^{17}$ atoms/cm$^3$.

In the above-described method for producing a silicon wafer, the activated metallic impurities may be subjected to gettering by the reaction with the oxygen precipitation nuclei in the silicon wafer.

In the above-described method for producing a silicon wafer, the metallic impurities may be composed of Cu.

A method for producing a semiconductor device according to the present invention comprises: performing formation of semiconductor device on a surface of a silicon wafer; and performing an activation of metallic impurities by irradiating laser light on metallic impurities constituting contaminants in the silicon wafer, activating the electric charging state of the metallic impurities, and performing gettering of the metallic impurities by a reaction with oxygen precipitation nuclei.

By this method, the above-described problem was overcome.

The above-described method for producing a silicon wafer may further comprise performing grinding of a back surface of the silicon wafer such that the silicon wafer has a predetermined thickness and removing a residual strain (residual strain accompanied with residual stress) caused by the grinding.

A method for producing a semiconductor device according to the present invention may comprise: performing formation of semiconductor device on a surface (front surface) of a silicon wafer; performing grinding a back surface of the silicon wafer such that the silicon wafer has a predetermined thickness and removing a residual strain (residual strain accompanied with residual stress) caused by the grinding; and performing an activation of metallic impurities by irradiating laser light on metallic impurities constituting contaminants in the silicon wafer, changing an electric charging state of the contaminants, and activating the contaminants to a state such that the contaminants easily react with oxygen precipitation nuclei.

Based on the extensive study, the inventor found the following phenomena. By laser light irradiation from the backside or front side of a silicon wafer, metallic impurities constituting contaminants in the silicon wafer are irradiated with the laser light and the electric charging states of the metallic impurities are changed to activated states such that the metallic impurities easily react with oxygen precipitation nuclei. In such a state, the metallic impurities react with the oxygen precipitation nuclei acting as a gettering sink, and are subjected to gettering.

In the following, the states of a silicon wafer before and after the laser light irradiation are explained with reference to a case in which a P type silicon wafer contaminated with Cu is irradiated with laser light. FIG. 1A shows a state before irradiation, and FIG. 1B shows a state after the irradiation.

As shown in FIG. 1A, in the silicon wafer before being irradiated with laser light, metallic impurities composed of Cu exist as positive ions (Cu+) dispersed in the crystal. Oxygen precipitation nuclei such as the nuclei formed by precipitation of an excessive amount of oxygen also exist in the crystal. In FIGS. 1A and 1B, the oxygen precipitation nuclei are indicated by solid circles (●). The oxygen precipitation nuclei are charged with a positive charge.

FIG. 5 illustrates energy states. As shown in FIG. 5, in a P type silicon wafer before the irradiation of laser light (γ), with respect to a valence band Ev and a conductance band Ec, the Fermi level is positioned at the side of the valence band.

When carriers are present in an amount of not less than the donor or acceptor concentration as shown in FIG. 1B, the Fermi level approaches the intrinsic region (mid-gap), and the electric charging state of Cu in an irradiated state due to laser light is converted from a positive state to a neutral state. The neutralized Cu is easily reacted with the oxygen precipitation nuclei which show oxygen precipitation-induced defects and are charged with a positive charge. This can be explained by the charging state. The positive charge is easily coupled with neutral charge, whereas the positive charge does not easily react with a positive charge.

FIG. 5A shows energy states before the laser light irradiation. FIG. 5B shows an energy states after the laser light irradiation. As shown in FIGS. 5A and B, after the irradiation of laser light (γ) having a wavelength of 900 nm, the Fermi level approaches the middle position between the valence band $E_v$ and the conductance band $E_c$. That is, with respect to the Fermi level $E_F$ before the irradiation, the Fermi level $E_F'$ after the irradiation rises and approachs the intrinsic Fermi level $E_i$. By this effect, the level of Cu$^+$ at $E_v$+0.1 eV to 0.3 eV is converted to Cu$^0$ and is easily subjected to gettering. The Fermi level is increased to 0.5 $E_F$, and the charging state of Cu is changed (activated) from positively charged Cu+ to neutral Cu$^0$.

As a result, because of its neutral charging state, the Cu is easily subjected to gettering. The Cu reacts with oxygen precipitation nuclei acting as a gettering sink as shown by an open circle connected with Cu$^0$ in FIG. 1. Although the Cu+ diffuses in the bulk wafer, diffusion of the gettering sink (oxygen precipitation nuclei capturing the Cu) is almost negligible.

According to the method for producing a silicon wafer of the present invention, by performing an activation of metallic impurities by irradiating laser light on metallic impurities constituting contaminants in the silicon wafer, the contaminants are activated to a state such that they easily react with oxygen precipitation nuclei, thereby performing gettering of metallic impurities and forming a gettering sink. Therefore, the gettering of metallic impurities (contaminants) is easily performed. In addition, since the gettering may be performed without performing a heat treatment for gettering, it is possible to avoid the high production cost and labor required by the above-described conventional techniques for gettering. In the conventional techniques, the heat treatment for gettering required a long time in an order of 10 hours, or the use of a heat treatment furnace to strictly control the contamination level. The latter case also required a long time including the time for pretreatment. According to the present invention, by irradiating a laser light on the wafer as an object, it is possible to provide the wafer with a desired state.

When a silicon wafer which may be contaminated with metallic impurities such as Cu is made into a thin film by grinding during the production process of a silicon wafer, by activating contaminants according to the present invention after the film thinning of the silicon wafer, without causing warpage or cracking of the wafer by the heat treatment, it is possible to produce a silicon wafer having high gettering ability capable of performing gettering of the contaminants in the silicon wafer effectively.

The laser light used for the present invention is not limited provided that the electric charging state of the metallic impurities (contaminants) is converted to an activated state in which the metallic impurities easily react with the oxygen precipitation nuclei. For example, for ensuring a carrier implantation of $1 \times 10^{15}$ atoms/cm$^3$, a laser light of 400 to 1100 nm in wavelength, and 1.0 to 4.0 eV in photon energy to ensure the carrier implantation if $1 \times 10^{15}$ atoms/cm$^3$ may be used. The laser light may be controlled in accordance with the species of the contaminants.

A photon energy of less than 1.0 eV is not preferable. When the photon energy of laser light is less than 1.0 eV, or alternatively, when the amount of carrier implantation is less than $1 \times 10^{15}$ atoms/cm$^3$, the Fermi level cannot be increased sufficiently, and there is a possibility that the electric charging states of the contaminants are not changed effectively, and the gettering of the contaminants is not performed sufficiently.

A wave length outside the range from 400 to 1000 nm, and a photon energy exceeding 4.0 eV are not preferable. When the wavelength is not within the range from 400 to 1100 nm, or the photon energy exceeds 4.0 eV, there is a possibility that the bulk region or device region of the silicon wafer suffer from an influence of the laser light irradiation and deterioration of the properties of the semiconductor device may occur.

In the present invention, the contaminants in the silicon wafer include contaminants originated from raw materials of the silicon wafer and mixed in the silicon wafer, or the contaminants mixed in the silicon wafer during the device process, grinding process or film thinning process after the device process. Heavy metals may constitute specific examples of the contaminants. The present invention is preferably applicable to a case in which contaminants are composed of heavy metals showing decrease of lifetime Lτ or diffusion length by irradiation of light (γ) as shown in FIG. 6. For example, the present invention is preferably applicable to a case in which the contaminants are composed of Cu which shows a decrease of lifetime from 22 μsec to 15 μsec by the light irradiation. On the other hand, the present invention is not preferably applicable to a case in which the contaminants are composed of heavy metals showing a recovery of lifetime decreased by light irradiation, or of heavy metals showing no change of diffusion length. For example, in the case of Fe, the lifetime is decreased from 100 μsec by the light irradiation, whereas the decreased lifetime is recovered within about 60 minutes. In a case of Ni, the diffusion length is not changed by the light irradiation.

A silicon wafer according to the present invention may be made of a silicon single crystal. For example, the silicon wafer may be sliced from a silicon single crystal having a resistivity of 0.01 Ωcm or more, an initial interstitial oxygen concentration of $8.0 \times 10^{17}$ atoms/cm$^3$ or more, and a concentration of carbon or nitrogen of $5.0 \times 10^{12}$ to $5.0 \times 10^{17}$ atoms/cm$^3$. By using such a silicon single crystal, a sufficient concentration of oxygen precipitation nuclei required for gettering is maintained at the time of laser irradiation. In addition, it is possible to maintain an interstitial oxygen concentration required for the concentration of the oxygen precipitation nuclei. The above-described conditions are conditions of a sample used in the experiment and are the conditions of general products that are commercially available currently.

It should be noted that a silicon wafer may be sliced from a silicon single crystal having an initial oxygen concentration different from the above-described range, or from a silicon wafer not doped with nitrogen or carbon, provided that the silicon wafer has oxygen precipitation nuclei needed for the gettering.

The method for producing a silicon wafer according to the present invention may be preferably applicable to the production of a semiconductor device. Where necessary, the above-described activation of contaminants may be performed one time or plural times, at any stage from the slicing of the silicon wafer to the dicing of the silicon wafer.

When the subsequent process only includes a heat treatment at a temperature of 100° C. to 150° C. or less, by performing the activation of contaminants in accordance with the present invention it is possible to perform the gettering of contaminants such as Cu and reduce the influence of the contaminants in the other region.

Where it is considered that a silicon wafer scarcely suffers from the influence of contaminants such as Cu after a predetermined stage, by performing the activation of metallic impurities after the predetermined stage, it is possible to inhibit the deterioration of the properties of a device. For example, the activation of metallic impurities according to the present invention may be performed after the backside-grinding as a post-process of a semiconductor device production.

The method for producing a semiconductor device according to the present invention comprises performing formation of semiconductor device on a surface (front surface) of a silicon wafer; subsequently performing grinding a back surface of the silicon wafer such that the silicon wafer has a predetermined thickness and removing a residual strain (residual strain accompanied with residual stress) caused by the grinding; and subsequently performing an activation of metallic impurities by irradiating laser light on metallic impurities constituting contaminants in the silicon wafer, changing electric charge of the contaminants, and activating the contaminants to a state such that the contaminants easily react with oxygen precipitation nuclei.

Because of the activation of contaminants after the grinding, even when the contaminants are released after the removal of residual stress caused by the grinding, contaminants in the silicon wafer are effectively subjected to gettering by the activation of contaminants.

According to the present invention, a necessity of a heat treatment for gettering can be avoided. Even when the silicon wafer is made into a thin film by grinding of the silicon wafer, gettering of contaminants in the silicon wafer may be effectively performed, and a silicon wafer of high quality can be provided. In addition, it is possible to provide a high quality semiconductor device which does not easily suffer from the influence of contaminants in the silicon wafer.

BRIEF DESCRIPTION OF THE DRAWINGS

FIG. 1A shows a state before the irradiation, and FIG. 1B shows a state after the irradiation.

FIGS. 5A and 5B are graphs for showing an energy level before and after the laser light irradiation.

DETAILED DESCRIPTION OF THE INVENTION

Hereafter, an embodiment according to the present invention is explained with reference to drawings.

In a method for producing a silicon wafer according to the present invention, for example, firstly, a silicon single crystal is grown by the CZ method such that the silicon single crystal has a resistivity of 0.01 Ωcm or more, initial interstitial oxygen concentration of $8.0 \times 10^{17}$ atoms/cm$^3$ or more, and doped with carbon or nitrogen in an amount of $5.0 \times 10^{12}$ to $5.0 \times 10^{17}$ atoms/cm$^3$. In this time, a desired silicon single crystal can be grown by controlling crystal pulling conditions such as the rotation cycle of a crucible, the species and flow rate of a gas introduced into the chamber of a pulling apparatus, the temperature distribution of a silicon melt, the convection of the silicon melt or the like.

Next, the thus obtained silicon single crystal is sliced using a cutting apparatus such as a wire saw, a slicer or the like. Where necessary, the sliced piece of the silicon single crystal is subjected to steps such as facing, lapping, etching, polishing or the like and is worked to a silicon wafer having a thickness of about 100 μm.

Figure 1A:
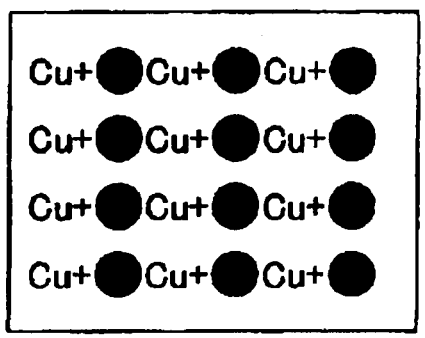
FIGS. 1A and 1B are drawings for explaining a state in a silicon wafer before and after laser light irradiation.
Figure 1B:
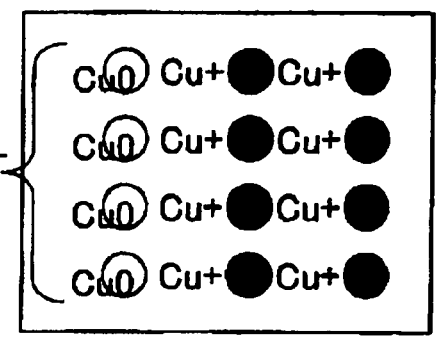
Figure 2:
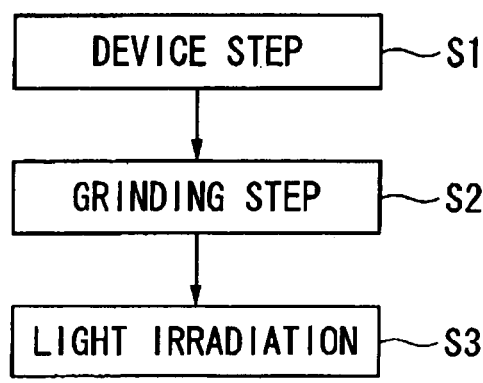
FIG. 2 is a flow chart for explaining an example of a method for producing a semiconductor device subjected to system-in-package as an example of a method for producing a semiconductor device according to the present invention.

After that, using the silicon wafer obtained by the above-described process, a semiconductor device is produced. FIG. 2 is a flow chart for explaining an example of a method for producing a semiconductor device according to the invention. As an example, the flow chart of FIG. 2 explains a method for producing a semiconductor device subjected to system-in-package (SIP).

Firstly, as shown in FIG. 2, a device formation step S1 is performed so as to form a desired semiconductor device which comprises electrodes, an oxide film, nitride film, interlayer insulation film or the like formed on the surface of the silicon wafer.

Next, the silicon wafer is subjected to a grinding step (S2) where the silicon wafer is subjected to lapping, and a back-surface of the silicon wafer is ground by CMP or the like such that the silicon wafer has a thickness of 20 to 50 μm, preferably 20 to 30 μm.

In the next step (light irradiation S3 (contaminants activation step)), by irradiating laser light from front a side and back side of the silicon wafer made of a thin film in the above-described step, contaminants in the silicon wafer are irradiated with the laser light. The laser light is controlled to have a wavelength of 400 to 1100 nm, photon energy of 1.0 to 4.0 eV. By the laser irradiation, the silicon wafer is implanted with carriers in an amount of not less than $1 \times 10^{15}$ atoms/cm$^3$. The laser light passes through the oxide film, nitride film, and interlayer insulation film formed in the device formation step and reaches the contaminants existing beneath those layers. By the laser light irradiation, the charging state of the contaminants changes such that the contaminants easily react with oxygen precipitation nuclei. Therefore, the contaminants are subjected to gettering by the reaction with the oxygen precipitation nuclei acting as gettering sinks.

The laser light may be irradiated to the whole area of the wafer surface. Alternatively, by condensing the laser light using a lens or the like, the laser light may be irradiated to a localized area. The region subjected to the laser light irradiation may be determined in accordance with the condition of contamination such as distribution of contaminants or the like. It is preferable to irradiate the laser light to both of the front face and back face of the silicon wafer. However, the laser light may be irradiated to one surface selected from front face and back face of the silicon wafer. The selection of the irradiated surface may be made in accordance with contamination conditions of the silicon wafer.

After the light irradiation step S3, the silicon wafer is subjected to dicing, bonding, and sealing. Thus, a semiconductor device according to the present invention is obtained.

EXAMPLE 1

A silicon single crystal was grown by the CZ method such that the silicon single crystal had a resistivity of 10 Ωcm, initial interstitial oxygen concentration of $1 \times 10^{18}$ atoms/cm$^3$, and carbon concentration of $1 \times 10^{15}$ atoms/cm$^3$. Cu was introduced to silicon wafers sliced from the single crystal such that each wafer had a Cu concentration of $1 \times 10^{12}$ atoms/cm$^3$. Thus P type silicon wafers doped with Cu were obtained. The wafers were irradiated with a laser light having a wavelength of 904 nm and photon energy of 1.1 eV. An amount of carrier implanted in the silicon wafer by the laser light irradiation for 1 minute was $1 \times 10^{17}$ atoms/cm$^3$. Recombination lifetime was measured using a microwave photoconductivity decay method. The result is shown in FIG. 3.

Figure 3:
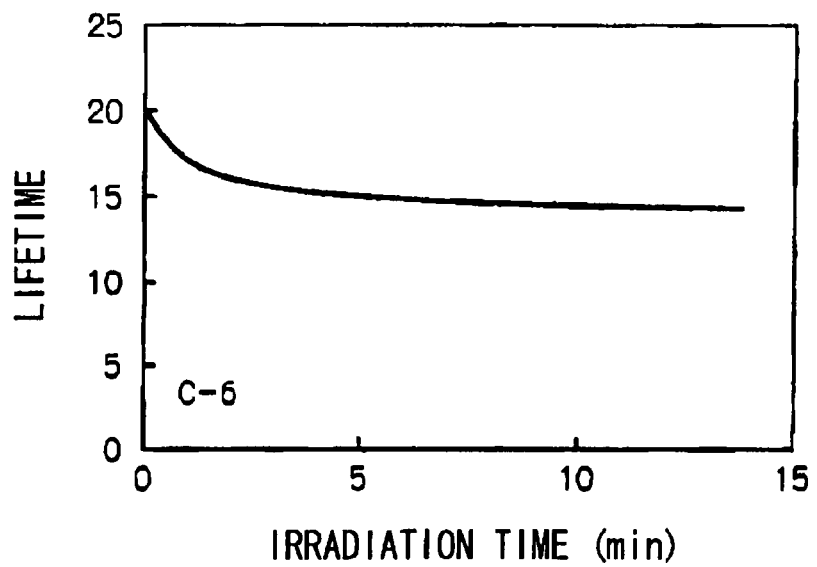
FIG. 3 is a graph for explaining a relationship between the recombination lifetime and duration of laser light irradiation.

FIG. 3 shows that a recombination lifetime decreases by the irradiation of the laser light. Therefore, it can be understood that defects having an ability to reduce the recombination lifetime were formed in the silicon wafer by the laser light irradiation. In general, the reduction of recombination lifetime occurs when a deep energy level is formed in the band gap of a silicon crystal. Therefore, it can be understood that the defects (gettering sinks) formed after the laser light irradiation are electrically active defects forming the origin of a deep energy level.

In addition, FIG. 3 makes it clear that the recombination lifetime decreased with increasing duration of laser light irradiation. In addition, the rate of reduction of the recombination lifetime shows a large value in the early stage of the irradiation. As a result, it was ensured that a preferable amount of carrier implantation was $1 \times 10^{15}$ atoms/cm$^3$ (laser irradiation time of 60 seconds or more). Further, the amount of carrier implantation of about $1 \times 10^{16}$ atoms/cm$^3$ (laser irradiation time of 5 minutes), amount of carrier implantation of about $1 \times 10^{17}$ atoms/cm$^3$ (laser irradiation time of 7 minutes), or laser irradiation time of about 10 minutes were more preferable.

EXAMPLE 2

In the same manner as in Example 1, a laser light was irradiated to silicon wafers. The relationship between the interstitial Cu concentration and the variation of recombination lifetime before and after the irradiation was examined. The recombination lifetime was determined by a microwave photoconductivity decay method.

The interstitial Cu concentration was measured based on the TID method. In the TID method, a metallic semiconductor junction is made on a Cu-diffused sample, and based on the thermal dependence of a transient response of junction capacitance, the volumetric density of Cu existing in the lattice interstitial site was determined quantitatively. Thus, the Cu existing in the interstitial site of silicon crystal was quantitatively evaluated.

As in the procedure of Example 1, the recombination lifetime was measured before and after the laser light irradiation. Based on the result, the variation of lifetime was determined as (lifetime before irradiation $L\tau^0$–lifetime after irradiation $L\tau'$)/lifetime after irradiation $L\tau'$. The result is shown in FIG. 4.

Figure 4:
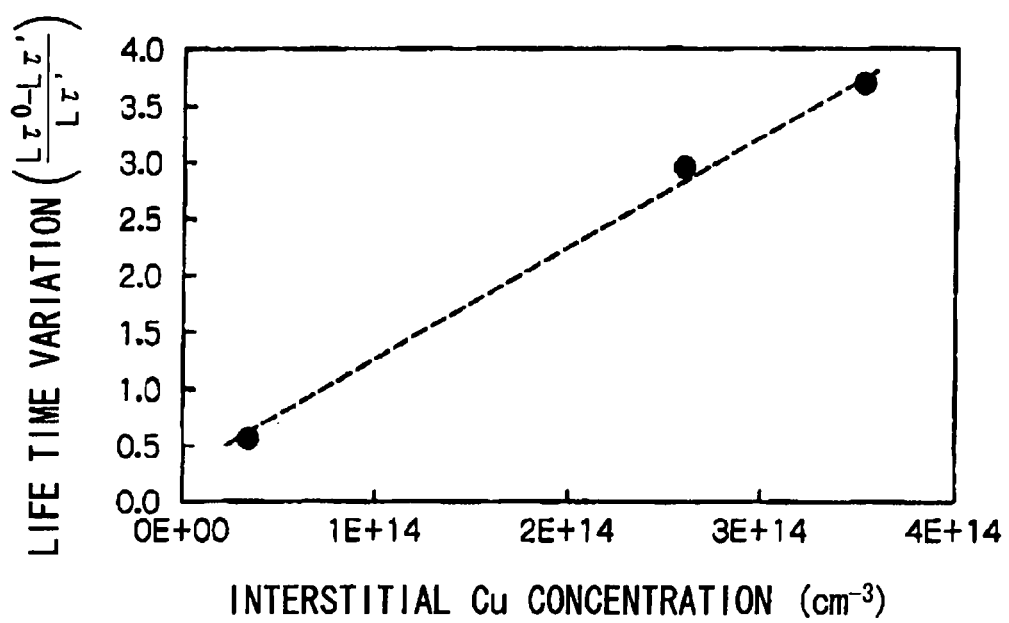
FIG. 4 is a graph showing a relationship between interstitial Cu concentration and the variation $((L\tau^0 - L\tau')/L\tau')$ in recombination lifetime before and after the laser light irradiation, where $L\tau^0$ denotes a lifetime before irradiation and $L\tau'$ denotes a lifetime after irradiation.
Figure 6:
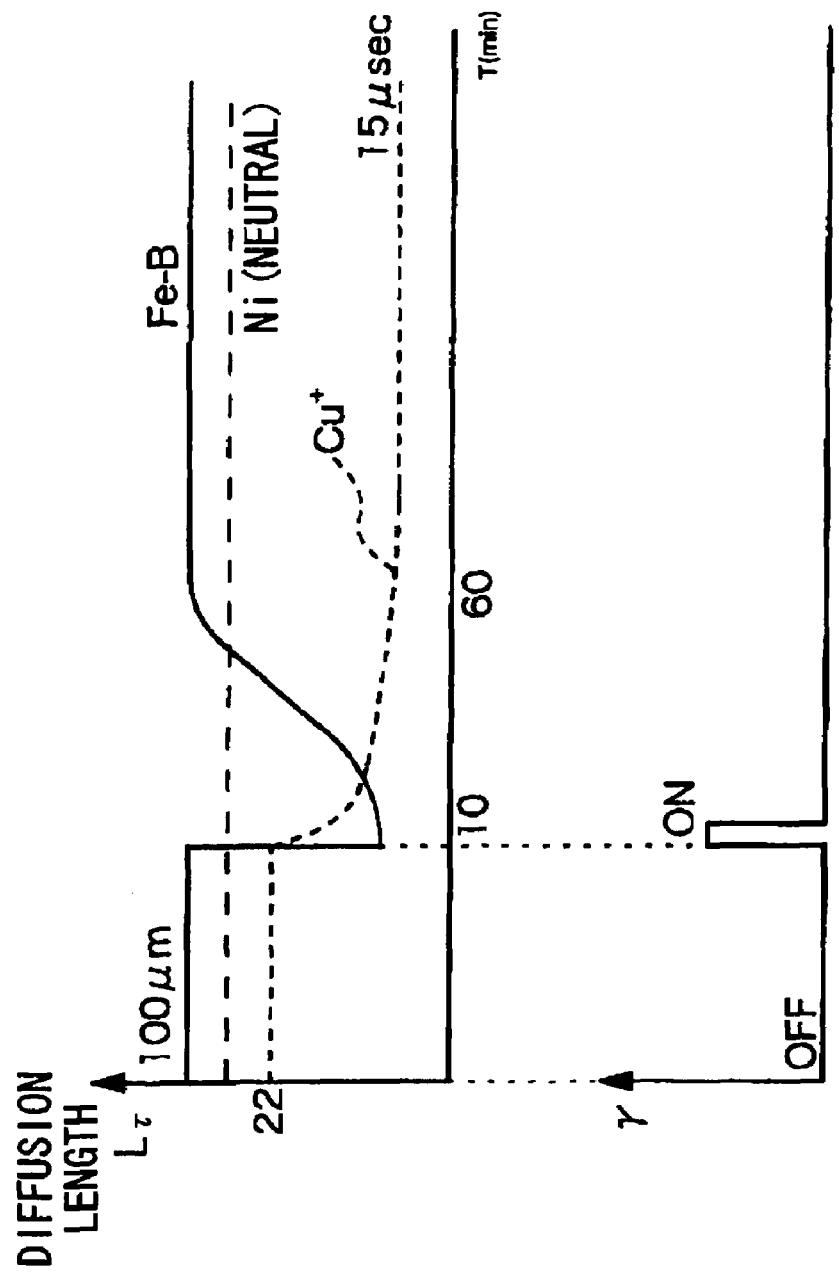
FIG. 6 is a graph showing time-dependent changes of lifetime (for Ni, and Cu) and diffusion length (for Fe) before and after the laser light irradiation.

From FIG. 4, it can be understood that the interstitial Cu concentration shows a small value (low concentration) as the variation of lifetime before and after the irradiation shows a large value. In addition, FIG. 4 shows a reduction of the interstitial Cu concentration by the irradiation of laser light, indicating formation of gettering sinks by the reaction of Cu with the oxygen precipitation nuclei. Irradiation of the laser light is stopped when the recombination lifetime shows a saturated value.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a silicon wafer, comprising performing an activation of metallic impurities by
    irradiating laser light on metallic impurities constituting contaminants in the silicon wafer,
    changing an electric charging state of the contaminants, and
    activating the contaminants to a state such that the contaminants easily react with oxygen precipitation nuclei and are subjected to gettering,
    wherein the laser light has a photon energy of 1.0 to 4.0 eV, a bulk of the silicon wafer is implanted with carriers in an amount of $1 \times 10^{15}$ atoms/cm$^3$ or more by the irradiation of laser light, and
    the carriers change the electric charging state of the contaminants.

2. The method for producing a silicon wafer according to claim 1, wherein the laser light has a wavelength of 400 to 1100 nm.

3. The method for producing a silicon wafer according to claim 1, wherein the silicon wafer is sliced from a silicon single crystal which is grown by the CZ method and has a resistivity of 0.01 Ωcm or more, initial interstitial oxygen concentration of $8.0 \times 10^{17}$ atoms/cm$^3$ or more, and doped with carbon or nitrogen in an amount of $5.0 \times 10^{12}$ to $5.0 \times 10^{17}$ atoms/cm$^3$.

4. The method for producing a silicon wafer according to claim 1, wherein the activated metallic impurities are subjected to gettering by the reaction with the oxygen precipitation nuclei in the silicon wafer.

5. The method for producing a silicon wafer according to claim 1, wherein the metallic impurities are composed of Cu.

6. The method for producing a silicon wafer according to claim 1, wherein the laser light is irradiated to the front surface of the silicon wafer, where the front surface is a surface for forming semiconductor device thereon.

7. The method for producing a silicon wafer according to claim 1, wherein the laser light is irradiated to a front surface and a back surface of the silicon wafer, where the front surface is a surface for forming semiconductor device thereon.

8. A method for producing a semiconductor device comprising:
    performing formation of semiconductor device on a surface of a silicon wafer; and
    performing an activation of metallic impurities by
    irradiating laser light to metallic impurities constituting contaminants in the silicon wafer,
    activating an electric charging state of the metallic impurities, and
    performing gettering of the metallic impurities by a reaction with oxygen precipitation nuclei.

9. The method for producing a silicon wafer according to claim 8, further comprising, before the activation of metallic impurities, performing grinding a back surface of the silicon wafer such that the silicon wafer has a predetermined thickness and removing a residual strain caused by the grinding.

* * * * *